US011125957B2

(12) United States Patent
Noguchi et al.

(10) Patent No.: US 11,125,957 B2
(45) Date of Patent: Sep. 21, 2021

(54) OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 0 days.

(21) Appl. No.: 16/936,459

(22) Filed: Jul. 23, 2020

(65) Prior Publication Data

US 2021/0033806 A1 Feb. 4, 2021

(30) Foreign Application Priority Data

Aug. 2, 2019 (JP) .............................. JP2019-143337

(51) Int. Cl.
*G02B 6/42* (2006.01)
*H01S 5/02212* (2021.01)

(52) U.S. Cl.
CPC ......... *G02B 6/4281* (2013.01); *G02B 6/4206* (2013.01); *G02B 6/4244* (2013.01); *G02B 6/4245* (2013.01); *H01S 5/02212* (2013.01)

(58) Field of Classification Search
None
See application file for complete search history.

(56) References Cited

U.S. PATENT DOCUMENTS

| 4,295,152 | A | * | 10/1981 | Khoe ................... G02B 6/4204 257/680 |
| 5,252,856 | A | * | 10/1993 | Murai ................. H01L 31/0203 257/678 |
| 5,691,536 | A | * | 11/1997 | Shimoyama .............. G01J 1/04 250/214.1 |
| 5,814,871 | A | * | 9/1998 | Furukawa ............. H01L 25/167 257/432 |
| 2003/0183894 | A1 | * | 10/2003 | Kohmoto .............. H01L 25/167 257/435 |
| 2004/0264980 | A1 | * | 12/2004 | Baek ...................... H04B 10/66 398/202 |
| 2007/0065079 | A1 | | 3/2007 | Mitamura |
| 2010/0025843 | A1 | * | 2/2010 | Iwaida ................. H01S 5/02212 257/693 |
| 2013/0182735 | A1 | * | 7/2013 | Hagimoto ........... H01S 5/02212 372/45.01 |

(Continued)

FOREIGN PATENT DOCUMENTS

JP 2004-253419 A 9/2004
JP 2007-088233 A 4/2007

*Primary Examiner* — Jerry Rahll
(74) *Attorney, Agent, or Firm* — Mattingly & Malur, PC

(57) ABSTRACT

An optical module includes an eyelet having a first surface, a second surface opposite to the first surface, and a penetration hole penetrating from the second surface to the first surface; a lead pin in the penetration hole, for transmitting electric signals; a pedestal protruding from the first surface in an extension direction of the lead pin; and a relay board on the pedestal, the relay board having a transmission line for electrically connecting an optical element and the lead pin. The lead pin is in no contact with an inner surface of the penetration hole. The lead pin has a flat surface which is at least a part of a surface bonded to the transmission line.

12 Claims, 10 Drawing Sheets

(56) References Cited

U.S. PATENT DOCUMENTS

| | | | | |
|---|---|---|---|---|
| 2013/0272663 A1* | 10/2013 | Katou | ................. | G02B 6/30 |
| | | | | 385/88 |
| 2015/0253520 A1 | 9/2015 | Huang et al. | | |
| 2016/0365700 A1* | 12/2016 | Noguchi | ............. | H01S 5/02212 |
| 2018/0026421 A1* | 1/2018 | Seidenfaden | ....... | H01S 5/02345 |
| | | | | 372/25 |
| 2018/0352648 A1* | 12/2018 | Kitamura | .............. | H01L 23/047 |

\* cited by examiner

OPTICAL MODULE

CROSS-REFERENCE TO RELATED APPLICATION

The present application claims priority from Japanese application JP2019-143337 filed on Aug. 2, 2019, the content of which is hereby incorporated by reference into this application.

BACKGROUND

1. Field

This relates to an optical module.

2. Description of the Related Art

Currently, most of the internet and telephone networks are built with optical communication networks. Optical modules used for interfaces of optical communication equipment such as a router/switch or transmission equipment plays an important role to convert electric signals into optical signals.

Transistor outline-can (TO-CAN) type optical modules used for optical communication generally have an electrically grounded stem and a lead pin penetrating an eyelet of the stem and being insulated from the eyelet. The stem and a cap attached to the stem constitute a housing in which an optical semiconductor device is housed. The lead pin and the eyelet constitute a coaxial line. The lead pin at one edge is electrically connected to the optical semiconductor device. The lead pin at another edge is connected to a driving device for outputting modulation electric signals, through a wiring substrate such as a flexible printed circuit board (FPC) with signal lines and the ground along them.

Recently, not only speeding up but also price reduction and downsizing are highly required for optical modules, in increasing demand for low-cost optical modules transmittable and receivable of high speed optical signals of 56-Gbit/s class.

For example, JP 2007-88233A and JP 2004-253419A disclose a TO-CAN type optical subassembly capable of transmitting electric signals to an optical semiconductor device using lead pins supported by glass as a dielectric filled in penetration holes in a disk-shaped eyelet.

The relative permittivity of the glass supporting the lead pins disclosed in JP 2007-88233A and JP 2004-253419A is 4 to 7, requiring a physical space for matching characteristic impedance of a glass coaxial portion to a desired value (ex. 50 ohm). For example, using glass with the relative permittivity of $\varepsilon r=6.7$ requires a penetration hole with a diameter of 2 mm or more, for matching the characteristic impedance of the coaxial line to 50 ohm. This has made it difficult to achieve both downsizing and high frequency characteristics.

For example, JP 2007-88233A discloses a design to apparently achieve 50 ohm in a low frequency area, by controlling volume of the glass in the penetration hole, in combination of a high impedance coaxial line with air gap as a medium and a low impedance coaxial line with glass as a medium. However, the characteristic impedance in a high frequency area of 56 Gbit/s class includes a steep inconsistency point, making it difficult to transmit the electric signals.

JP 2004-253419A also discloses that the inconsistency of characteristic impedance is eliminated by making smaller the diameter of a cavity in the penetration hole, but downsizing is difficult due to necessity of the physical space, as mentioned above, for matching the characteristic impedance of the glass coaxial portion to 50 ohm. Additionally, sink marks on a mounting surface of the FPC may lead to the high impedance area, or the glass filled in the small diameter part may lead to the low impedance area.

US 2015/0253520 A1 discloses not the structure where the lead pin is inserted in the penetration hole in the eyelet, but a non-hermetic structure where a carrier, on which an optical semiconductor device is mounted, is directly connected to an FPC, using bonding wires. The structure in US 2015/0253520 A1, where the wires are directly bonded on the FPC in the housing, requires a thicker gold plating on the FPC in terms of wire pull strength, leading to increase in cost. Steps of centering assembly and electrical testing need passing electricity through the FPC, requiring many FPC connectors to be prepared. Additionally, the FPC is an interface to the PCB on which a driver IC is mounted, leading to diversity in adoption of layouts and materials depending on types, whereby flexibility, pad pitch and thickness vary. Therefore, it is necessary to design a connector for each type, and a certain amount of capital investment is required for mass production. The structure of US 2015/0253520 A1 is disadvantageous in terms of cost, compared to the structure where the lead pin is inserted in the penetration hole in the eyelet, as disclosed in JP 2007-88233A and JP 2004-253419A.

SUMMARY

This is to solve the above problems and to aim at balancing downsizing and high frequency characteristics of an optical module with an eyelet having a penetration hole in which a lead pin is inserted.

An optical module includes an eyelet having a first surface, a second surface opposite to the first surface, and a penetration hole penetrating from the second surface to the first surface; a lead pin in the penetration hole, for transmitting electric signals; a pedestal protruding from the first surface in an extension direction of the lead pin; and a relay board on the pedestal, the relay board having a transmission line for electrically connecting an optical element and the lead pin. The lead pin is in no contact with an inner surface of the penetration hole. The lead pin has a flat surface which is at least a part of a surface bonded to the transmission line.

DETAILED DESCRIPTION

Hereinafter, a first embodiment of the disclosure is described with reference to drawings.

Figure 1:
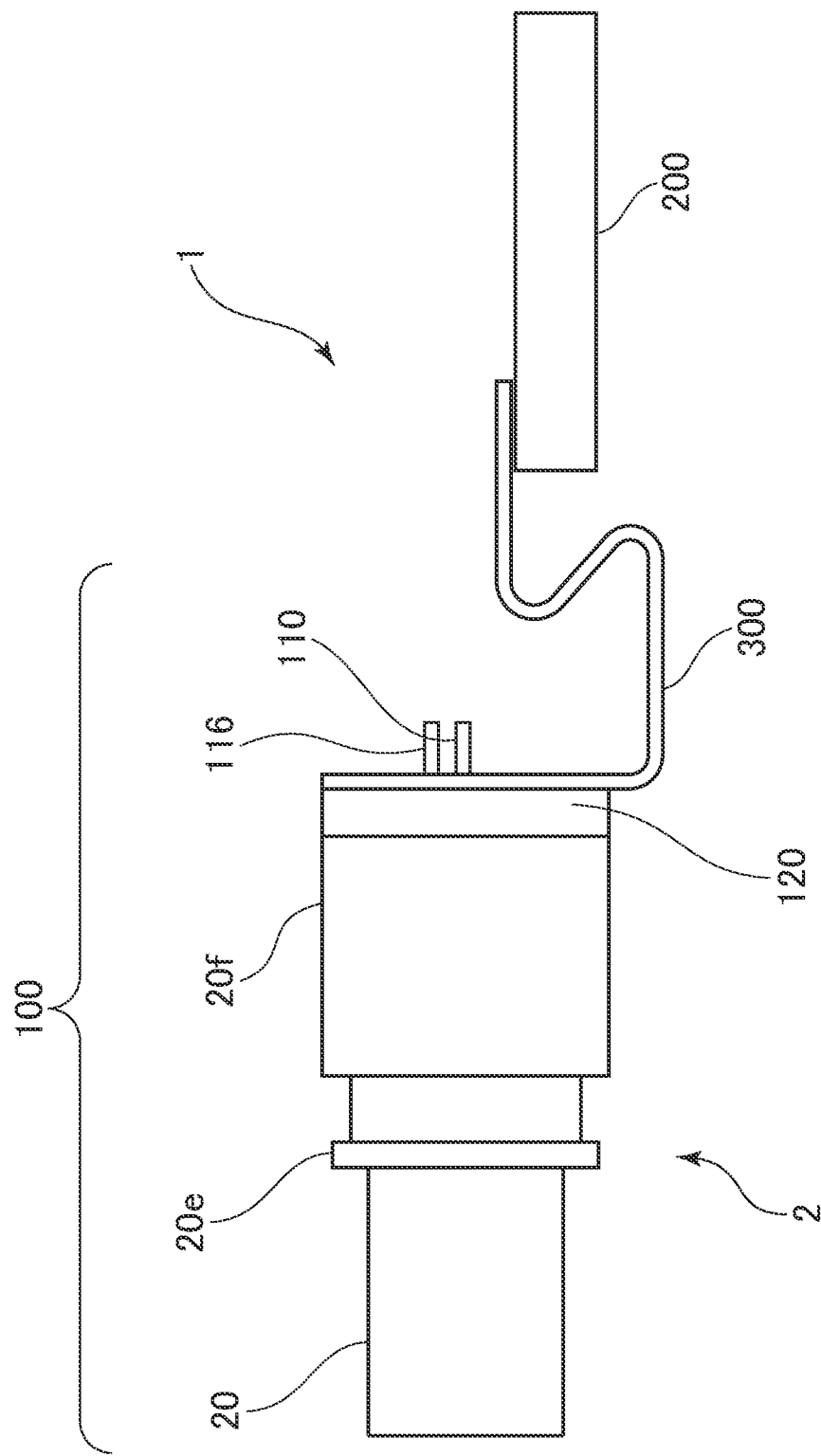
FIG. 1 is an exterior view of an optical module in a first embodiment.

FIG. 1 is an exterior view of an optical module 1 for optical communication in the embodiment. Modulation electric signals and control signals may be transmitted to an optical subassembly 100, from a driver IC (not shown) mounted on a PCB 200, through a FPC 300 connected to the PCB 200 with solder among others. The FPC 300 is a circuit substrate with flexibility. The optical subassembly 100 stores an optical element and is equipped with an interface for sending or receiving outgoing or incoming light. The optical subassembly 100 has an eyelet 120 and an optical receptacle 2. Although not illustrated, the optical subassembly 100, the PCB 200, and the FPC 300 are in a housing that could be made of metal, thereby constituting the optical module 1.

Figure 2:
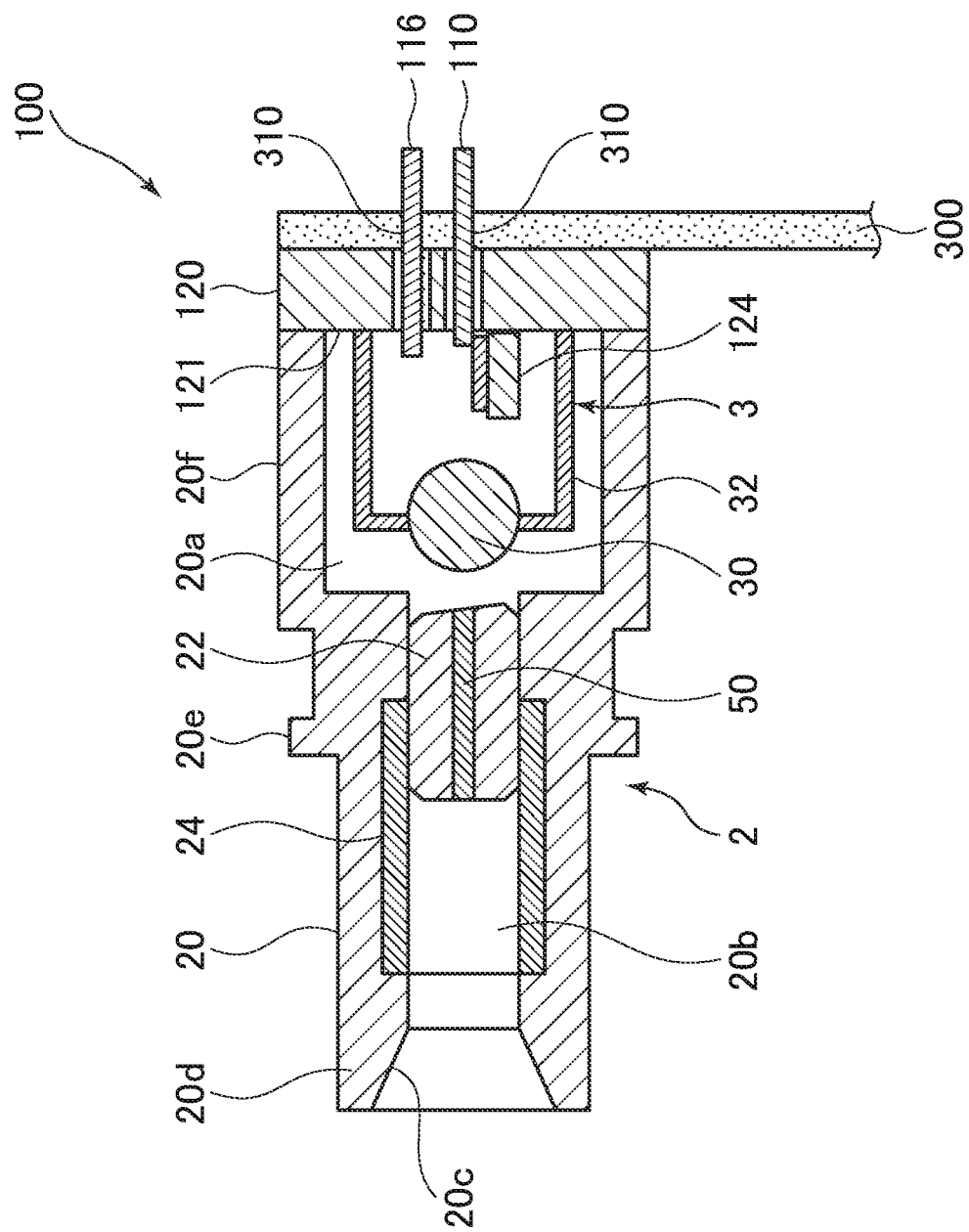
FIG. 2 is a schematic view of a cross section structure of an optical subassembly in the first embodiment.

FIG. 2 is a schematic view of a cross section structure of the optical subassembly 100 in the embodiment. As illustrated in FIG. 2, the optical subassembly 100 in the embodiment includes an optical receptacle 2 and an optical package 3. The optical receptacle 2 is equipped with an optical receptacle body 20, a stub 22, and a sleeve 24.

The optical receptacle body 20 of the embodiment is configured to include an integrally formed resin member and is equipped with an optical package storage unit 20f in a cylindrical contour and an optical fiber insertion part 20d in an almost cylindrical shape with an outer diameter smaller than an outer diameter of the optical package storage unit 20f. The optical package storage unit 20f and the optical fiber insertion part 20d are connected to each other at respective edge faces.

The optical package storage unit 20f has a recess 20a in a circular shape, coaxial with an external shape, and has a cylindrical shape.

The optical receptacle body 20 has a penetration hole 20b extending from a tip surface of the optical fiber insertion part 20d, coaxially along an external shape of the optical fiber insertion part 20d, to a bottom surface of the recess 20a in the optical package storage unit 20f. That is, the optical receptacle body 20 has the recess 20a and the penetration hole 20b penetrating to outside from the recess 20a.

The penetration hole 20b has a tapered section 20c, at an end part of an internal surface, in a tapered shape with a larger diameter outward. This makes it easy to insert a connector with an external optical fiber into the penetration hole 20b.

The optical fiber insertion part 20d has a flange 20e along a perimeter.

The stub 22 could configured to contain zirconia. The stub 22 has an approximate cylindrical shape almost as large in diameter as the penetration hole 20b at the optical fiber insertion part 20d of the optical receptacle body 20, thereby holding an optical fiber 50 coaxial with the stub 22. The stub may be pressed into and fixed to the optical fiber insertion part 20d of the optical receptacle body 20. The stub has a right edge face diagonally grinded. This makes it possible to prevent interference between light input to the optical fiber 50 and reflection light.

The stub 22 of the optical receptacle 2 on a left side is in contact with a connector (not shown) inserted in the penetration hole 20b from outside and holding an external optical fiber, connecting the external optical fiber held by the connector and the optical fiber 50 held by the stub 22.

The sleeve 24 has a split sleeve that may contain zirconia. The sleeve 24 has an approximate cylindrical shape with an inner diameter almost as large as the penetration hole 20b, and is embedded in a trench formed in an internal surface of the optical receptacle body 20. The sleeve 24 enables position adjustment, in the penetration hole 20b, of the connector with the external optical fiber inserted in the optical fiber insertion part 20d.

The optical package 3 has a lens 30 in a spherical shape. The optical package 3 has a lens support portion 32, a metallic member in a cylindrical shape with a base, having in a bottom surface an opening almost as large as the lens 30. The opening of the lens support portion 32 is coaxial with an outline of the bottom surface of the lens support portion 32. The lens 30 is fit in the opening of the lens support portion 32. That is, the lens support portion 32 supports the lens 30.

The optical package 3 has a stem including the above eyelet 120 and a pedestal 124. The stem is made of metal, for example, and is electrically connected to a ground conductor on the FPC 300 to be electrically grounded. Specific connection of the ground conductor and the stem will be described later.

The optical subassembly 100 can be assembled by adhesively fixing bonding surfaces, of the optical receptacle body 20 and a first surface 121 of the eyelet 120. The optical receptacle body 20 and the eyelet 120 constitute a housing. The lens support portion 32 welded to the eyelet 120 and the lens 30 fit in the lens support portion 32 are configured to be in the recess 20a of the optical receptacle 2. That is, the lens 30 and the lens support portion 32 are stored in the recess 20a of the optical receptacle body 20. The way to bond the optical receptacle 2 and the optical package 3 is not limited hereto.

The optical subassembly 100 is, for example, a transmitter optical subassembly (TOSA) storing a light-emitting element such as a laser diode (e.g. EML; electric field absorption modulator integrated laser) for converting electric signals to optical signals, a receiver optical subassembly (ROSA) storing a light-receiving element such as a photodiode for converting received optical signals to electric signals, or a bidirectional optical subassembly (BOSA) with both functions. Any one of the optical subassemblies is applicable here.

Figure 3:
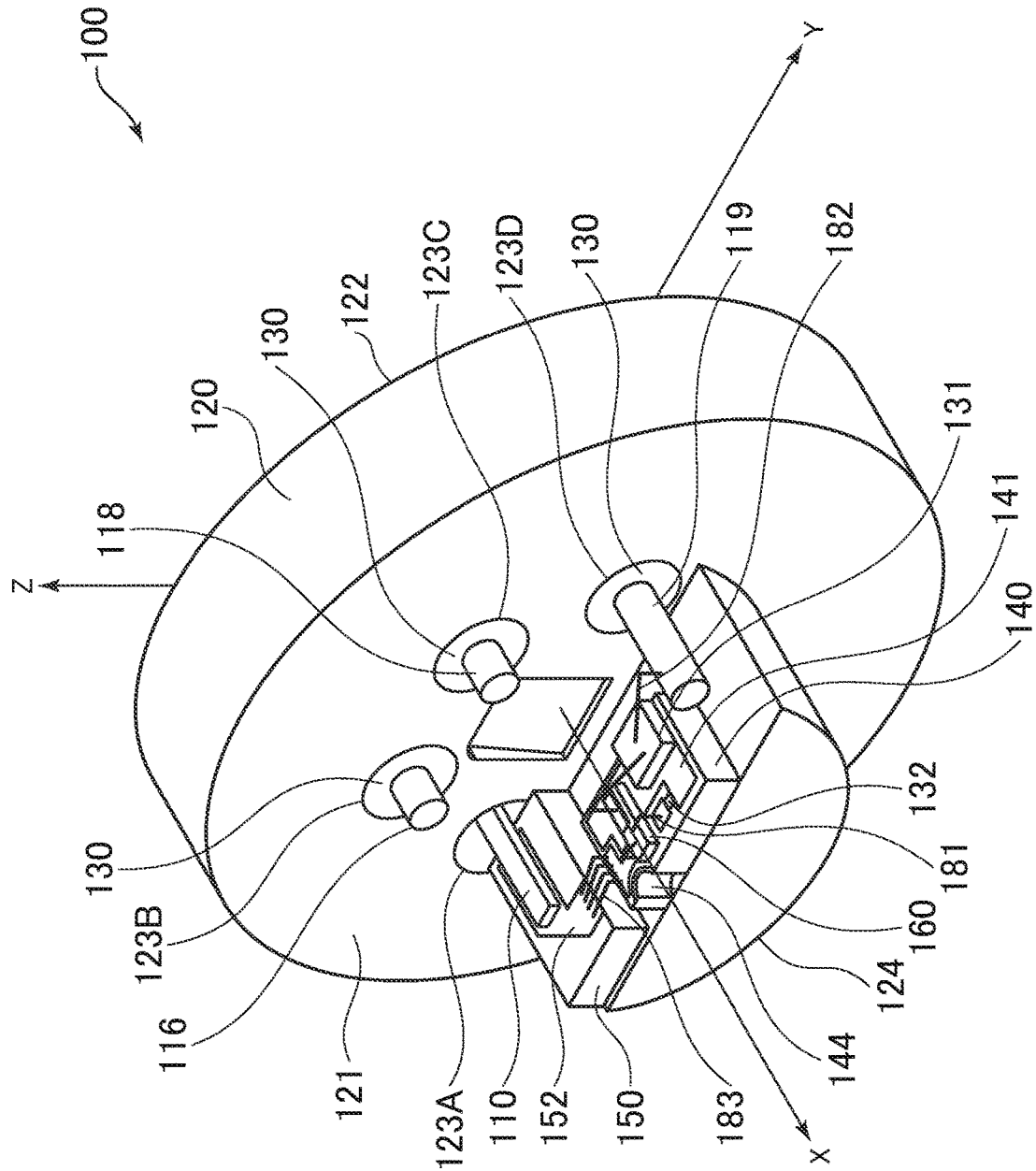
FIG. 3 is a schematic perspective view of an interior of the optical subassembly in the first embodiment.
Figure 4:
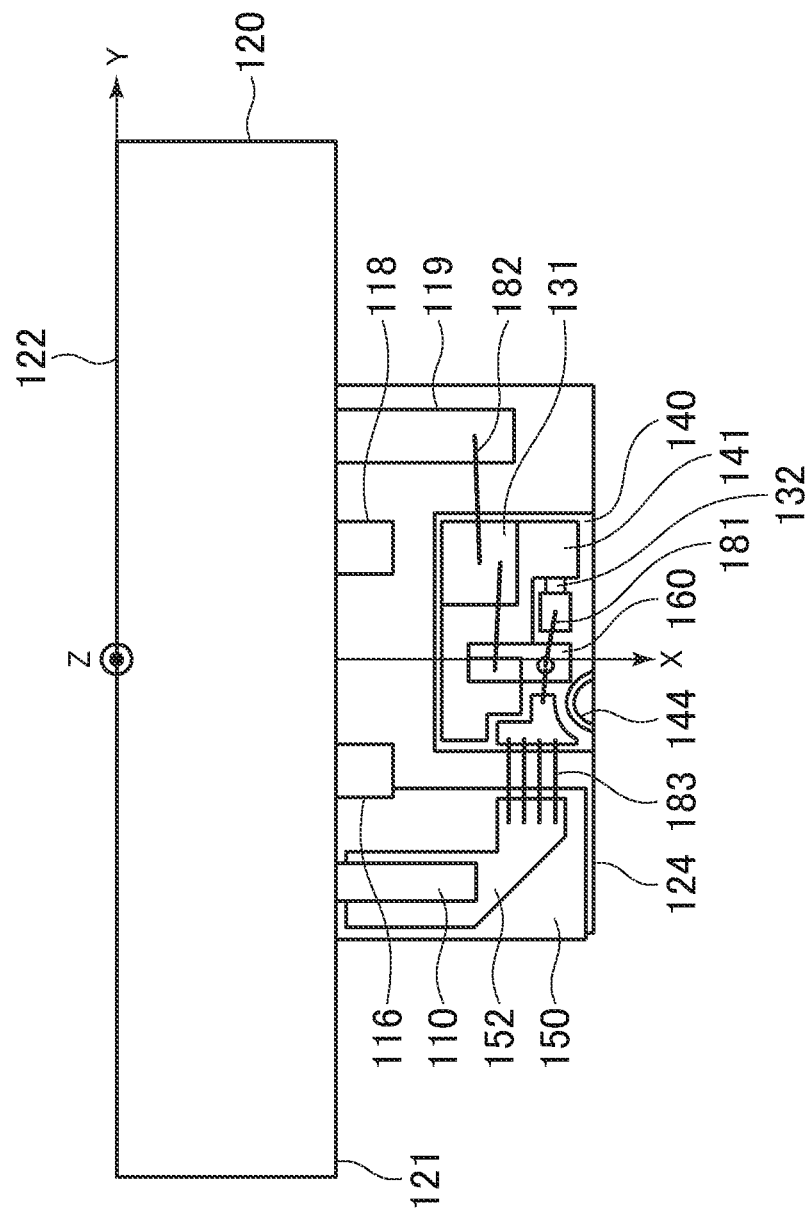
FIG. 4 is a schematic plan view, parallel to an eyelet and from a direction perpendicular to an upper surface of a pedestal, of the optical subassembly in the first embodiment.

FIG. 3 is a schematic perspective view of an interior of the optical subassembly 100 in the first embodiment. FIG. 4 is a schematic plan view, from a perpendicular direction (Z axis direction) to an upper surface of a relay board 150 on a pedestal 124, of the optical subassembly 100 in the first embodiment. The optical subassembly 100 has the eyelet 120, made of metal for example, with conductivity, and in a disk shape with a diameter of 5.6 mm. The eyelet 120 has the first surface 121 and a second surface 122 opposite to the first surface 121. The eyelet 120 has some penetration holes 123 (123A, 123B, 123C, and 123D) penetrating from the first surface 121 to the second surface 122.

A first lead pin 110 is inserted in the first penetration hole 123A. A second lead pin 116 is inserted in the second penetration hole 123B, a third lead pin 118 is inserted in the third penetration hole 123C, and a fourth lead pin 119 is inserted in the fourth penetration hole 123D. The first lead pin 110, the second lead pin 116, the third lead pin 118, and the fourth lead pin 119 extend a direction (X axis direction) perpendicular to the first surface 121 of the eyelet 120, sticking out from the first surface 121 of the eyelet 120.

Each lead pin and a corresponding penetration hole 123 are electrically insulated. Specifically, a first lead pin 110, for transmitting modulation electric signals to an optical element 160, is inserted in the first penetration hole 123A, in no contact with the inner surface of the first penetration hole 123A, whereby an air layer for a dielectric intervenes between the first penetration hole 123A and the first lead pin 110. The eyelet 120, the air layer, and the first lead pin 110 constitute a waveguide. The optical element 160 is an element such as a semiconductor laser, for converting the optical signal and the electric signal at least from one to another. The dielectric 130 such as glass filled in the penetration hole intervenes between the second penetration hole 123B and the second lead pin 116, between the third penetration hole 123C and the third lead pin 118, and between the fourth penetration hole 123D and the fourth lead pin 119. The dielectric 130 such as the glass plays a role to hold each lead pin, except the first lead pin 110, in the corresponding penetration hole 123.

The optical subassembly 100 has a pedestal 124, sticking out in an extension direction (X axis direction) of the first lead pin 110 from the first surface 121 of the eyelet 120, made of metal for example, and with conductivity. The eyelet 120 and the pedestal 124 may be integrally formed, both of them constituting the stem.

A heat dissipation substrate 140 and a relay board 150 are fixed to an upper surface of the pedestal 124, possibly with solder or conductive adhesive. The heat dissipation substrate 140 is a substrate on which the optical element 160 is mounted, has high thermal conductivity, and is made of an insulation material close to the optical element 160 in a thermal expansion coefficient. In the embodiment, the heat dissipation substrate 140 may be made of aluminum nitride. The heat dissipation substrate 140 has a first conductor pattern 141 formed on an upper surface; the first conductor pattern 141 and the optical element 160 are electrically connected to each other with a first bonding wire 181. Besides the optical element 160, a thin film resistance 132 or a bypass condenser 131 may be mounted on the heat dissipation substrate 140. The modulation electric signal with a high frequency component is terminated at the thin film resistance 132, preventing a reflected wave from turning back to the driver IC (not shown). The bypass condenser 131 separates high frequency signals superimposed on direct current signals. The heat dissipation substrate 140 has a castellation 144 for stabilizing the ground and reducing loss of the high frequency signals.

The fourth lead pin 119 is electrically connected to the first conductor pattern 141, through a second bonding wire 182 and the bypass condenser 131. The second lead pin 116 and the third lead pin 118 are pins for supplying electric power to other than the optical element 160, for example, to an unillustrated photodiode for monitoring output of the optical element 160.

The first lead pin 110 for transmitting modulation electric signals to the optical element 160, in FIGS. 3 and 4, is connected by soldering to the relay board 150 which is an insulation substrate on the pedestal 124. The connection between the first lead pin 110 and the relay board 150 is not limited to the soldering but brazing with other brazing fillers is applicable hereto. The relay board 150 has a second conductor pattern 152 for a transmission line between the optical element 160 and the first lead pin 110.

With the relay board 150 having the second conductor pattern 152, the first conductor pattern 141 and the first lead pin 110 can be connected to each other with some third bonding wires 183, reducing parasitic inductance and enabling impedance matching up to a high frequency area. With the relay board 150 having the second conductor pattern 152, a lower surface of the first lead pin 110 and the second conductor pattern 152 can be brazed (or soldered), enabling impedance matching up to the high frequency area, by forming capacitance between the lower surface of the first lead pin 110 and a ground pattern on a back side of the relay board 150.

The first lead pin 110, different from other lead pins (the second lead pin 116, the third lead pin 118, the fourth lead pin 119), has a flat surface within at least a part of a surface connected to the second conductor pattern 152 of the relay board 150. The first lead pin 110 in FIG. 3 has a cuboid shape with the flat surface within the lower surface connected to the relay board 150. With such a structure, the first lead pin 110 can be fixed to the relay board 150 on the upper surface, although unable to be fixed by the air layer as the dielectric in the first penetration hole 123A. This makes it unnecessary to fill the first penetration hole 123A with the dielectric 130 such as glass for fixing the first lead pin 110, whereby the dielectric between the first penetration hole 123A and the first lead pin 110 can be the air layer. This can lower permittivity between the first penetration hole 123A and the first lead pin 110. This results in matching to a desired impedance value in spite of a shorter distance between the inner surface of the first penetration hole 123A and the side of the first lead pin 110. That is, downsizing of the optical module 1 is compatible with high frequency characteristics.

Figure 6:
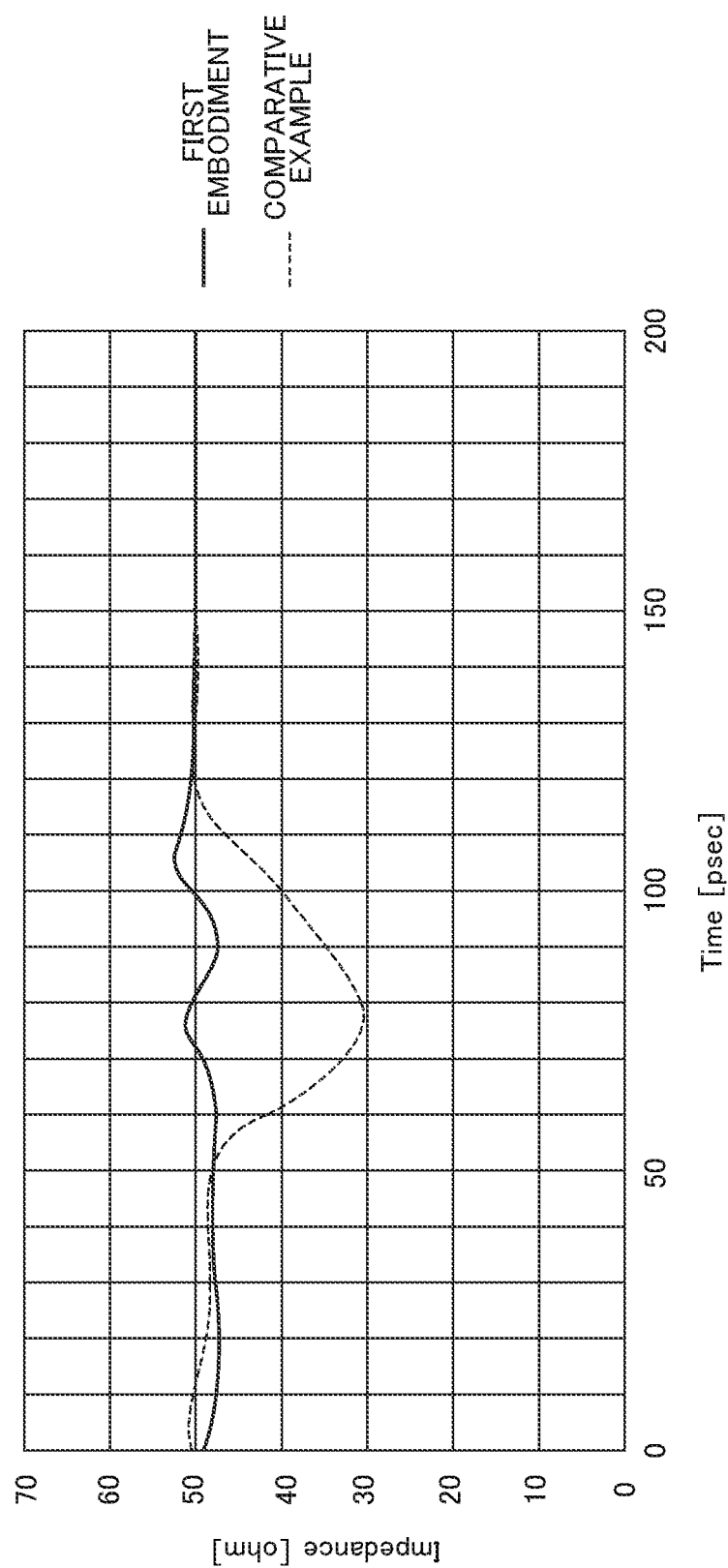
FIG. 6 is comparative result of time domain reflectometry of the optical module in the first embodiment and an optical module of a comparative example.

FIG. 6 is comparative result of time domain reflectometry (TDR) of the optical module 1 in the first embodiment and an optical module of a comparative example. The optical module in the comparative example has a penetration hole, corresponding to the first penetration hole 123A in the embodiment, filled with dielectric made of glass; a lead pin inserted in the penetration hole has a cylindrical shape like the second lead pin 116 in FIG. 3.

In FIG. 6, the time around 70 psec corresponds to a connection point of the first lead pin 110 and the FPC; the time around 70 psec to 120 psec corresponds to characteristics of a waveguide composed of the lead pin 110 and the penetration hole 123A. As shown in FIG. 6, the characteristics in the comparative example shows significantly low impedance at a coaxial line portion, due to high permittivity of the glass. On the other hand, the characteristics in the first embodiment has satisfactory characteristics due to lack of impedance inconsistency at the waveguide portion.

The first lead pin 110 has the flat surface within at least a part of the surface connected to the relay board 150, therefore preventing the first lead pin 110 from rolling in a direction (Y axis direction in FIG. 3), perpendicular to the extension direction and parallel to the surface, of forming the second conductor pattern 152, of the relay board 150, leading to a merit of easy positioning.

Figure 5:
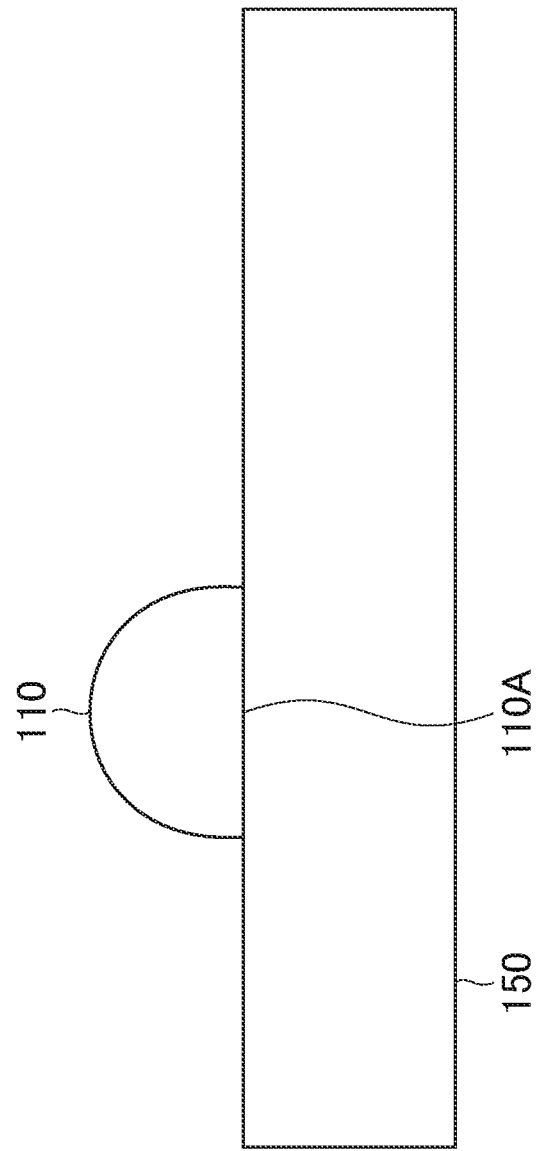
FIG. 5 is a schematic plan view of a first lead pin and a relay board, from a direction perpendicular to a first surface, of another specific eyelet in the first embodiment.

The shape of the first lead pin 110 is a cuboid in FIG. 3 but it is not limited to the example in the disclosure. FIG. 5 is a schematic plan view of a first lead pin 110 and a relay board 150, from an X axis direction, of another example in the embodiment. As shown in FIG. 5, the first lead pin 110 has the flat surface 110A only within the surface connected to the relay board 150 and has curved surfaces within an upper surface and a side; never the less the upper surface of the relay board 150 can be effectively used for fixing the first lead pin 110. Easy positioning is another merit to be achieved.

The first lead pin 110 has the shape such as the cuboid shape in FIG. 3, where at least a part of the side parallel to the extension direction of the first lead pin 110 is perpendicular to the upper surface of the relay board 150, making it easy to effectively form a fillet at the side of the first lead pin 110 during soldering to the relay board 150. In the disclosure, being "perpendicular to the upper surface of the relay board 150" is not strictly 90 degrees to the upper surface of the relay board 150 but means a range between 85 degrees and 95 degrees, thereby leading to an effect that the fillet is easy to be formed on the side of the first lead pin 110. The shape of the first lead pin 110 is not limited to the cuboid shape in FIG. 3; as long as at least a part of the side parallel to the extension direction of the first lead pin 110 is perpendicular to the upper surface of the relay board 150, the fillet can be easily formed effectively.

Figure 7:
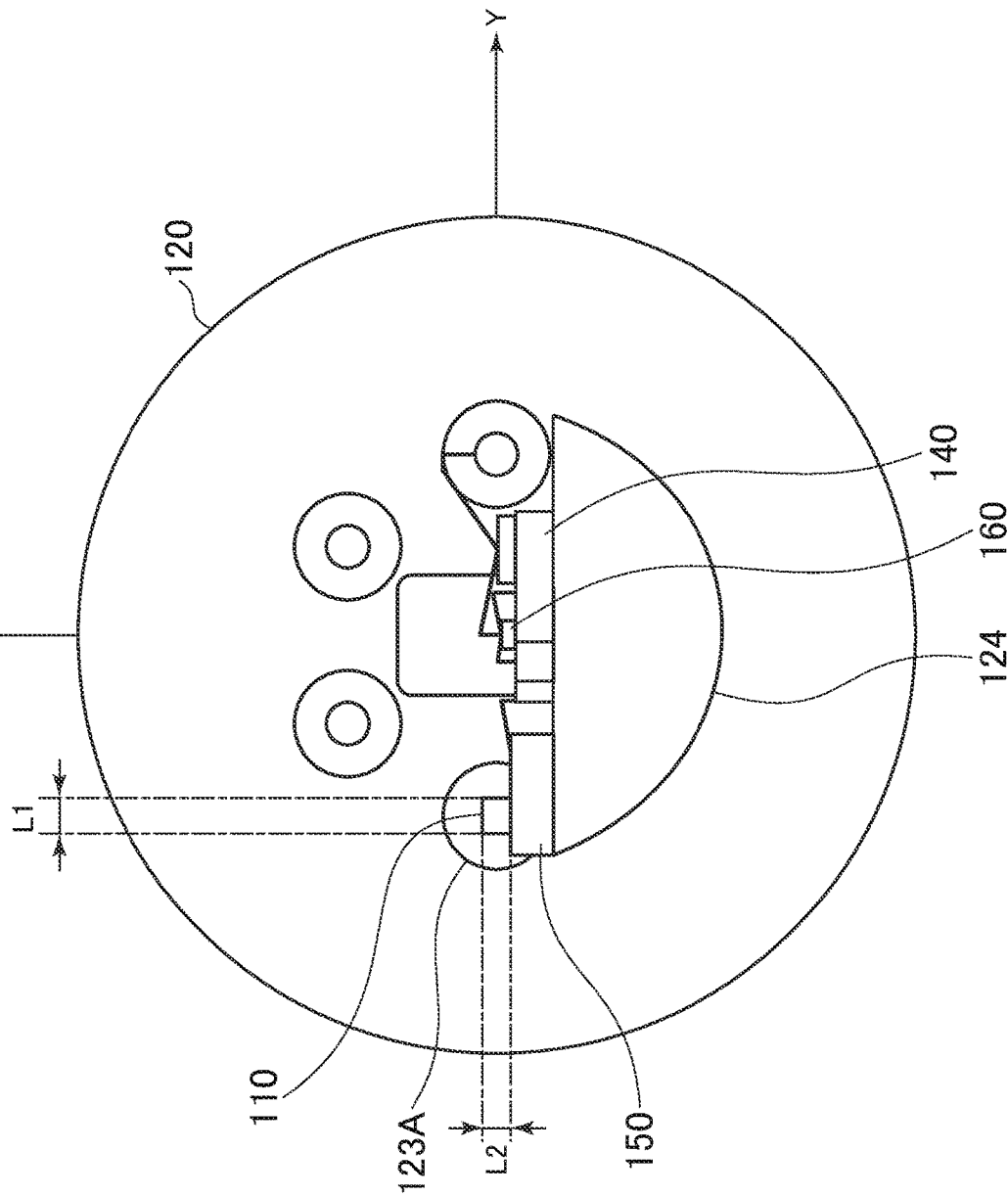
FIG. 7 is a schematic plan view, from a direction perpendicular to the first surface of the eyelet, of the optical subassembly in the first embodiment.
Figure 8:
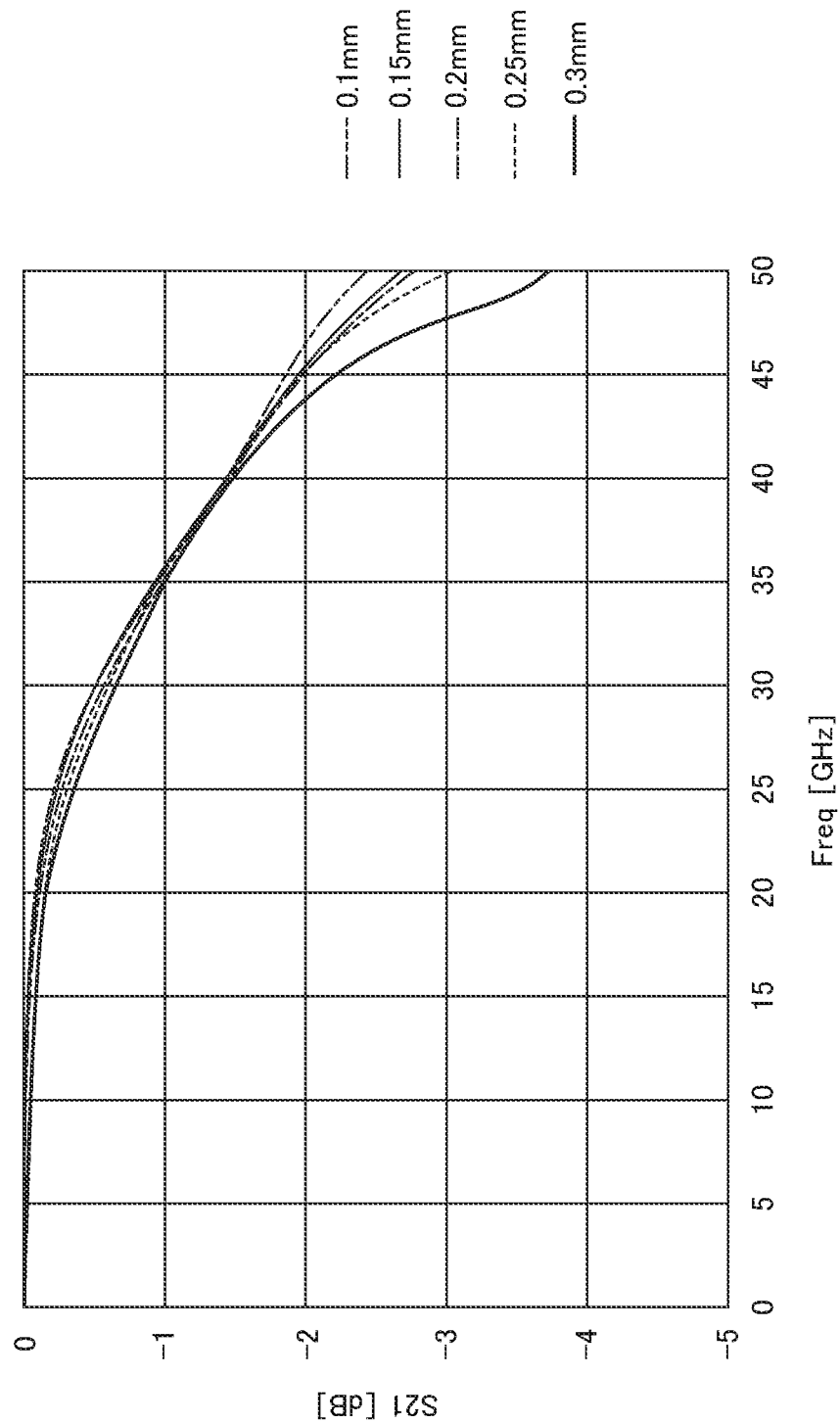
FIG. 8 is a graph of transmission property of the optical module in the first embodiment, calculated using a three-dimensional electromagnetic field simulator HFSS (High Frequency Structure Simulator).

FIG. 7 is a schematic plan view, from the X axis direction, of the optical subassembly 100 in the first embodiment. FIG. 8 is a graph of transmission property (S21) of the optical module 1 in the first embodiment, calculated using a three-dimensional electromagnetic field simulator HFSS (High Frequency Structure Simulator).

FIG. 8 shows a transmission property result of simulation where the first lead pin 110 in FIG. 7 is fixed with a width L1 being 0.25 mm in in the Y axis direction and gradually varies in a thickness L2 from 0.1 mm to 0.3 mm in the Z axis direction. Referring to FIG. 7, the first lead pin 110 with a smaller thickness L2 in the Z axis direction can more clearly control quality degradation of electric signals transmitted to the optical element 160 in high frequency area of 40 GHz or more. This is achieved by making the first lead pin 110 externally smaller for an internal conductor, keeping a distance between the inner surface of the first penetration hole 123A and the first lead pin 110, controlling an impedance drop. From the result in FIG. 8, the thickness L2 of the first lead pin 110 in the Z axis direction should be less than 0.3 mm.

By contrast, from a viewpoint of ensuring bonding strength of the first lead pin 110 to the relay board 150, the width L1 in the Y axis direction should be greater within a secured distance to the inner surface of the first penetration hole 123A. Therefore, the width L1 of the first lead pin 110 in the Y axis direction should be equal to or more than the thickness L2 in the Z axis direction.

The width L1 of the first lead pin 110 in the Y axis direction should be four times the thickness L2 or less in the Z axis direction. The reasons are explained below. First, considering mounting variation of the first lead pin 110 on the second conductor pattern 152, the width L1 of the first lead pin 110 should be 0.4 mm or less in the Y axis direction. By contrast, from a viewpoint of securing strength, the thickness L2 of the first lead pin in the Z axis direction should be 0.1 mm or more. Therefore, the width L1 of the first lead pin 110 in the Y axis direction should be four times the thickness L2 or less in the Z axis direction.

The first lead pin 110 may curve or be bent in the Z axis direction; the distance in the Z axis direction between the first lead pin 110 and the inner surface of the first penetration hole 123A should be secured enough to avoid risk of being short-circuited due to contact of the first lead pin 110 and the inner surface of the first penetration hole 123A. Therefore, the thickness L2 of the first lead pin 110 should be 0.2 mm or less in the Z axis direction, thereby securing the distance to the inner surface of the first penetration hole 123A in the Z axis direction.

The diameter of the first penetration hole 123A should be 0.6 mm or more and should be 1 mm or less. Being 1 mm or less can downsize the eyelet 120, and being 0.6 mm or more can secure processability of eyelet 120 with a certain thickness.

Figure 9:
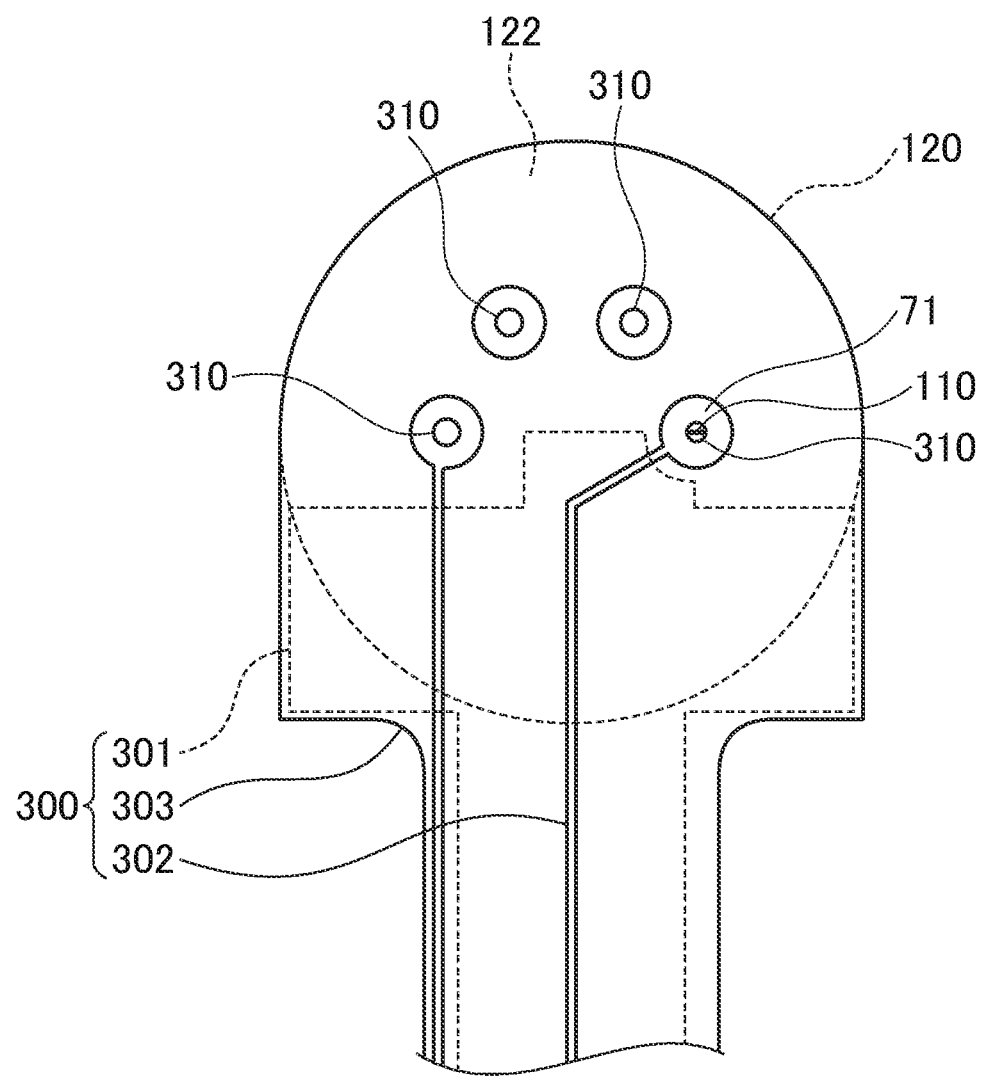
FIG. 9 is a schematic plan view, from a back side of a FPC, of connection of the FPC with the eyelet and each lead pin in the first embodiment.
Figure 10:
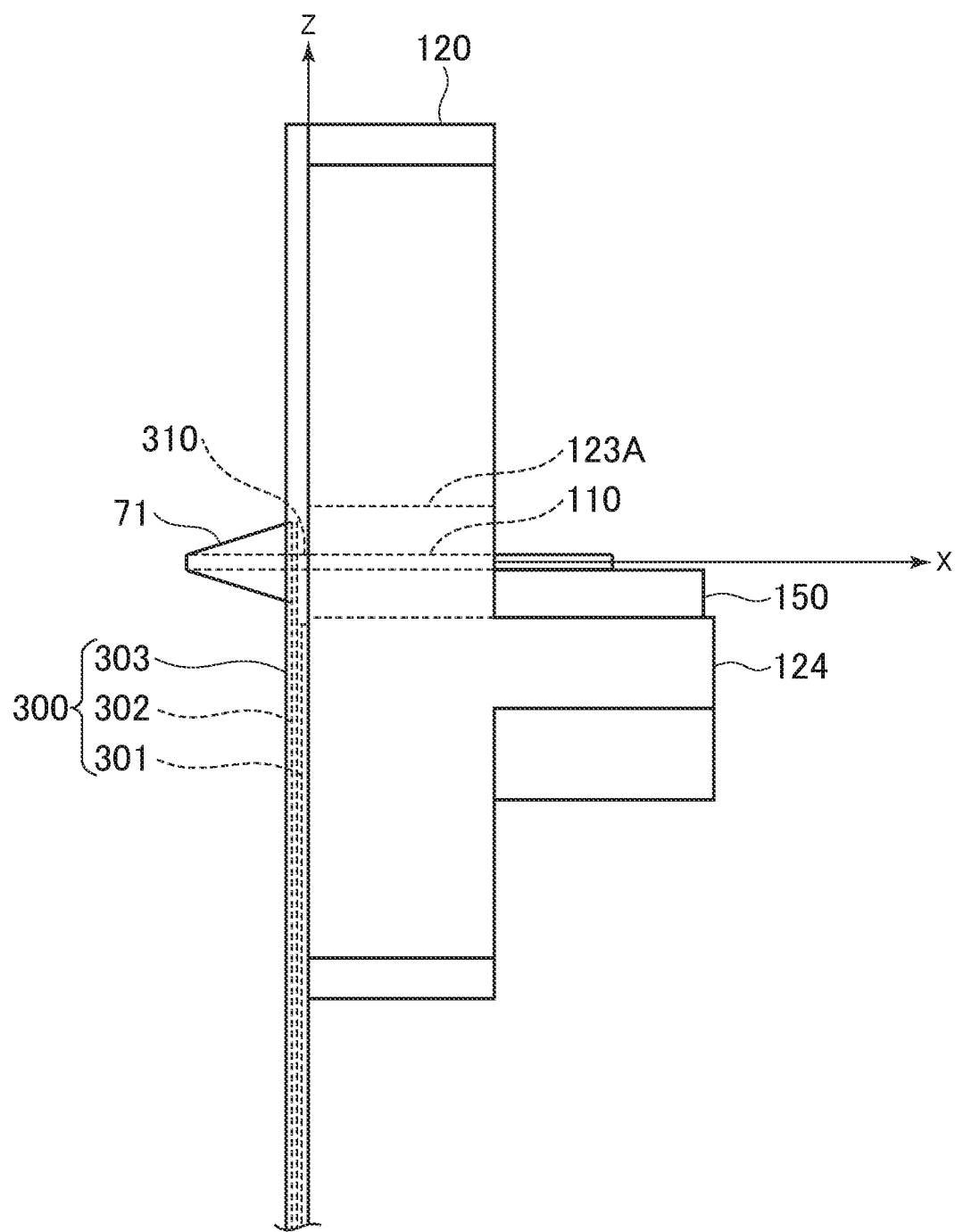
FIG. 10 is a schematic perspective view, from a side direction of the eyelet, of connection of the FPC and a first lead pin in the first embodiment.

FIG. 9 is a schematic plan view, from a back side of the FPC 300, of connection of the FPC 300 with the eyelet 120 and each lead pin in the first embodiment. FIG. 10 is a schematic perspective view, from a side direction of the eyelet 120, of connection of the FPC 300 and the first lead pin 110 in the first embodiment.

In FIGS. 9 and 10, the FPC 300 has penetration holes 310, in each of which a lead pin is inserted. In FIG. 10, the FPC 300 has an insulation film 303 for a base, a ground conductor 301 on the eyelet, and a signal line 302 separated from the ground conductor 301. The first lead pin 110 and the signal line 302 are electrically connected to each other with solder 71 applied to a back side of the FPC 300.

In FIG. 10, the first penetration hole 123A is hollow, the solder 71 is likely to flow from the second surface 122 into the first penetration hole 123A. Assuming the solder 71 is on the inner surface of the first penetration hole 123A, the impedance of the waveguide composed of the eyelet 120 and the first lead pin 110 should be set more than 50 ohm.

In FIGS. 9 and 10, the second surface 122 of the eyelet 120 is entirely covered with the FPC 300, on which a planar ground conductor 301 is in face-to-face contact with the second surface 122 of the eyelet 120, whereby a foreign object is less likely to get in between the FPC 300 and the eyelet 120. This makes it less unlikely that the foreign object gets in the first penetration hole 123A that is hollow and that the foreign object gets on the surface on which the optical element 160 is mounted. For the above reason, the opening in the second surface 122 of the first penetration hole 123A should be covered with the FPC 300.

The optical module 1 is explained in a single-ended type in the first embodiment of the disclosure but may have another penetration hole, different from the first penetration hole 123A, penetrating from the first surface 121 to the second surface 122 of the eyelet 120 and another lead pin inserted in the other penetration hole, for transmitting differential signals through the first lead pin 110 and the other lead pin.

What is claimed is:

1. An optical module comprising:
   an eyelet having a first surface, a second surface opposite to the first surface, and a penetration hole penetrating from the second surface to the first surface;
   a lead pin in the penetration hole, for transmitting electric signals;
   a pedestal protruding from the first surface in an extension direction of the lead pin; and
   a relay board on the pedestal, the relay board having a conductor pattern for electrically connecting an optical element and the lead pin, the relay board having an insulation substrate on which the conductor pattern is entirely formed,
   wherein the lead pin is in no contact with an inner surface of the penetration hole, and the lead pin has a flat surface which is at least a part of a surface opposed and bonded to the conductor pattern.

2. The optical module according to claim 1, wherein at least a part of a side of the lead pin is perpendicular to an upper surface of the relay board.

3. The optical module according to claim 1, further comprising a circuit substrate with flexibility, the circuit substrate having a ground conductor in face-to-face contact with the second surface.

4. The optical module according to claim 3, wherein the circuit substrate covers an opening of the penetration hole in front of the second surface.

5. The optical module according to claim 1, further comprising another lead pin in another penetration hole penetrating from the second surface to the first surface, for transmitting differential signals with the first lead pin.

6. The optical module according to claim 1, further comprising solder on the inner surface of the penetration hole.

7. The optical module according to claim 1, wherein the penetration hole has a diameter of 1 mm or less.

8. The optical module according to claim 7, wherein the diameter of the penetration hole is 0.6 mm or more.

9. The optical module according to claim 1, wherein the lead pin has a thickness of less than 0.3 mm in a direction perpendicular to an upper surface of the relay board.

10. The optical module according to claim 9, wherein the thickness of the lead pin is 0.2 mm or less.

11. The optical module according to claim 1, wherein
the lead pin has a width in a direction perpendicular to an extension direction of the lead pin and parallel to a transmission-line-formed surface of the relay board,
the lead pin has a thickness in another direction perpendicular to an upper surface of the relay board, and
the width is greater than or equal to the thickness.

12. The optical module according to claim 11, wherein the width is less than four times the thickness.

* * * * *